United States Patent [19]

Bunting

[11] Patent Number: 4,983,246

[45] Date of Patent: Jan. 8, 1991

[54] HOT STAMPING DECAL RESIST

[75] Inventor: William M. Bunting, Loudonville, N.Y.

[73] Assignee: Mint-Pac Technologies, North Haven, Conn.

[21] Appl. No.: 389,008

[22] Filed: Aug. 3, 1989

[51] Int. Cl.$^5$ .................... H01L 21/312; B44C 1/165
[52] U.S. Cl. ................................ 156/240; 156/659.1; 156/660
[58] Field of Search ................. 156/240, 659.1, 904, 156/660; 428/206; 430/281, 288

[56] References Cited

U.S. PATENT DOCUMENTS

| | | | |
|---|---|---|---|
| 4,294,641 | 10/1981 | Reed et al. | 156/240 X |
| 4,421,814 | 12/1983 | Piazza | 428/206 X |
| 4,725,524 | 2/1988 | Elzer et al. | 430/288 X |

Primary Examiner—David Simmons
Assistant Examiner—James J. Engel, Jr.
Attorney, Agent, or Firm—Jerry A. Miller

[57] ABSTRACT

This present invention is directed to a new technique for supplying and applying resist to copper and other substrate material. In accordance with the present invention, a hot stamping resist decal comprises a release sheet bearing a pattern of the dried residue of a resist. The resist comprises an ester of a styrene/maleic anhydride copolymer, a particulate filler, and a solvent. Advantageously, a plasticizer is included in the resist formulation and the particulate filler preferably includes a clay. The method of manufacturing the inventive hot stamping resist decal and for hot stamping the decal on a circuit board form additional aspects of the present invention.

5 Claims, 1 Drawing Sheet

HOT STAMPING DECAL RESIST

BACKGROUND OF THE INVENTION

The present invention relates to circuit board manufacture in general and more particularly to an improved etch resist in the form of a decal for hot stamping an image on copper or other substrate surface.

In recent years, there has been an accelerating trend towards simultaneous circuit size reduction and expansion of function in high performance electronic systems. Printed wiring board (PWB) technology has played an integral role in its evolution. Surface mount technology (SMT) has introduced new requirements in the design of PWBs, such as the use of substrates with fine lines and close spacing, small diameter plated through holes (PTH) and vias, and chip carriers with large numbers of fillet solder joints. In multi-layer printed wiring board construction (MLPWB), the evolution of PWB laminates (often composed of multiple thin laminates or "thin lams") has been prompted by greater device complexity, as well as the need to package these devices in a smaller volume. Maximum circuit integrity under adverse conditions also is a design criterion.

MLPWBs typically are constructed from a series of individual PWBs having insulative layers separating each PWB. Standard multi-layer boards, for example, can range from about 2 to 20 layers, each laminate ranging in dielectric thickness from about 1 to 250 mils. Conventional practice can adequately lay down artwork on each individual PWB followed by conventional etching and plating operations. Such conventional processing for the new generation of PWBs has been possible due to the flat, planar nature of conventional PWBs.

A recent development in circuit board manufacture involves the injection molding of three-dimensional circuit boards that require the circuits to traverse non-planar areas on the board and which have three-dimensional attachment portions for mounting other components to the board or mounting the board into an electrical unit. The three-dimensional nature of such injection molded circuit boards can be appreciated by reference to FIG. 2, for example. Conventional circuit processing techniques do not permit ramps and other non-planar areas to be conventionally imaged and certainly this is not feasible when structural attachment features are placed among the circuits on the board. Thus, new techniques for laying down circuits on these boards need to be developed.

BROAD STATEMENT OF THE INVENTION

The present invention is directed to a new technique for supplying and applying resist to copper and other substrate material. In accordance with the present invention, a hot stamping resist decal comprises a release sheet bearing a pattern of the dried residue of a resist. The resist comprises an ester of a styrene/maleic anhydride copolymer, a particulate filler, and a solvent. Advantageously, a plasticizer is included in the resist formulation and the particulate filler preferably includes a clay. The method of manufacturing the inventive hot stamping resist decal and for hot stamping the decal on a circuit board form additional aspects of the present invention.

Advantages of the present invention include a resist that tents printed circuit holes allowing for plated through holes. Another advantage is a resist that has excellent copper adhesion. A further advantage is a resist that can be removed after its resist function by stripping with aqueous alkaline media, thus contributing to the environmental acceptability of the process. Yet another advantage is a resist that provides sharp image lines. These and other advantages will be readily apparent to those skilled in the art based upon the disclosure contained herein.

Figure 1:
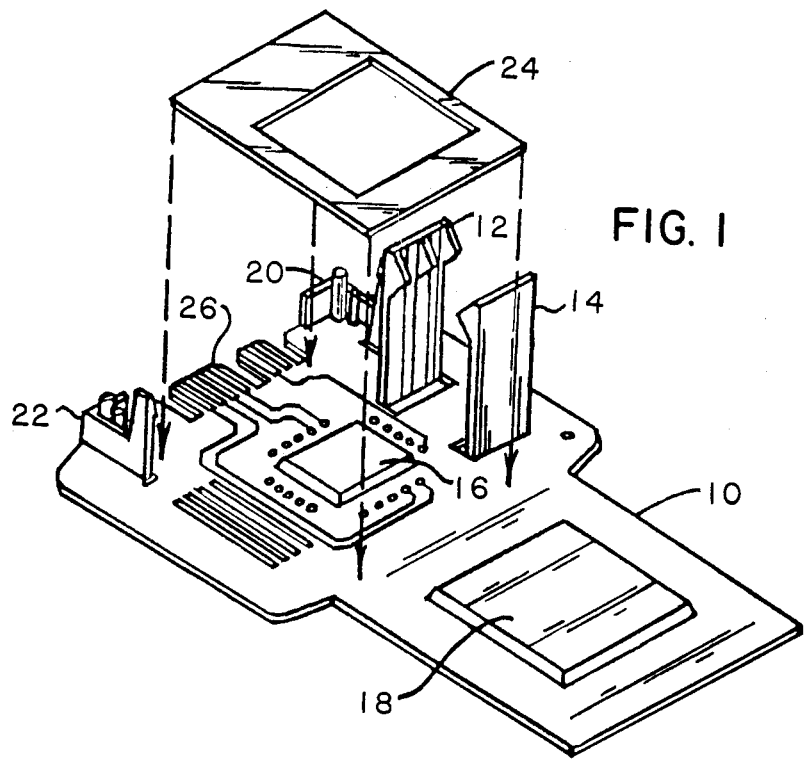
FIG. 1 is a perspective elevational view of the novel hot stamping resist decal and circuit board wherein the positioning of the decal on the circuit board is illustrated.

The drawings will be described in detail in connection with the description that follows.

DETAILED DESCRIPTION OF THE INVENTION

The inventive resist decal is useful for hot stamping an image on copper or other substrate surface for the purpose of providing an etch resist or a plating resist such as is required for imaging printed circuit boards. The particular value of this resist is that it has the ability to tent printed circuit board holes, has excellent copper adhesion, and can be removed after its resist function is completed merely by stripping with an aqueous alkaline solution. This stripping property is particularly desirable from an environmental pollution and safety (no combustibles) viewpoint. The ingredients comprising the hot stamping resist decal comprise a release sheet and a pattern of the dried residue of a resist thereon. The ingredients used in formulating the resist pattern on the decal comprise an ester of a styrene/maleic anhydride copolymer, a particulate filler, optionally a plasticizer, and a solvent to achieve application viscosity.

The esterified styrene/maleic anhydride copolymer provides the film integrity required for producing a pattern of the resist. The esterified copolymer additionally provides thermal stability to the resist on the circuit board. Its low molecular weight does not adversely contribute to unacceptably high viscosities of the resist for screen printing or other application of the resist onto the decal. Additionally, the ester copolymer produces an acid to neutral pH resistant film so that the board can be etched conventionally. Finally, the ester copolymer produces a film which can be removed in dilute aqueous alkaline media, such as, for example, 5% sodium hydroxide solution. The proportion of styrene/maleic anhydride copolymer ester generally ranges from between 35 to about 65 percent by weight of the solids content of the resist.

An optional, though preferable, additive included in the resist is a plasticizer. Plasticizers reduce the tendency of the resist to be brittle, especially along the edges which may chip and result in circuit opens. Most often, ester plasticizers are used, such as, for example, acetyl triethyl citrate, butyl phthalyl butyl glycolate, acetyl tri-n-hexyl citrate, tributoxyethyl phosphate, tributoxyethoxyethyl adipate, dibutoxyethyl phthalate, and the like, and mixtures thereof. The amount of plasticizer used, if any, will vary from manufacturer to manufacturer, but generally ranges from about 10 to 30 percent by weight of the solids content of the resist composition.

In order to provide a printed decal for hot stamping of improved image thickness, image continuity, and image edge sharpness, viscosity modifiers can be added. Image thickness is important in providing sufficient resistance to etchants. Image continuity is important because image opens or narrow spots (necking) results in circuit opens or circuit necking. Image edge sharpness is important in allowing closer placement of adjacent circuit lines without shorts.

A variety of particulate fillers, often called inserts, are well known in the paint and ink field. Particulate fillers useful for inclusion in the hot stamping resist of the present invention include, for example, fumed silica, barium sulfate, talc, and the like and mixtures thereof. The proportion of particulate filler can range widely depending upon the ultimate solids content desired, the amount of solvent required with increasing quantities of filler, the ability to suspend the filler in the resist (prevent settling) prior to application to the release sheet, and the like. Broadly, the proportion of particulate filler found useful for the inventive resist ranges from between about 1 and 40 percent by weight of the solids content.

In order to further improve decal characteristics, uniform film thickness, image continuity, and edge sharpness, it is desirable to add a rheological additive such as an organoclay. A rheological additive imparts thixotropic properties to the formulation. Broadly, the proportion of organoclay ranges from 1 to 15 percent of the solids content.

A variety of conventional solvents can be used in formulating the resist ink of the present invention. These solvents desirably have a sufficiently high flash point so that the resist is not highly combustible. Worker safety also dictates that relatively high boiling point solvents be utilized. The solvents, of course, must have the capability of solvating or dispersing the styrene/maleic anhydride ester copolymer and other ingredients (if not already liquid). Also, all of the ingredients must be compatible and such compatibility often is promoted by judicious selection of solvents, or mixtures thereof. Representative solvents for use in the resist of the present invention include, for example, diacetone alcohol, ethylene glycol monobutyl ether, propylene glycol monobutyl ether, and like oxygenated solvents. In some cases, it may be desirable to replace part of the oxygenated solvent with a highly aromatic-containing naptha, primarily to reduce viscosity.

Optionally, the resist can contain additional thermoplatic materials in order to modify the rheology of the resist, improve the solids content for thicker films, and the like. Of course, optional thermoplastic additives similarly must be compatible with the styrene/maleic anhydride ester copolymer, plasticizer used, particulate fillers used, and the like. Also, for ease of use of the novel resist, it is desirable to include a tinctorial pigment therein, such as, for example, copper phthalocyanine (a blue pigment). A variety of other tinctorial pigments can be used as is necessary, desirable, or convenient. Opacifying pigments, e.g. titanium dioxide, additionally can be used so that workers can visually observe where the ink has been applied which also promotes visual inspection of the resist on the release sheet and the hot-stamped resist on the circuit boards.

A variety of conventional release sheets or heat transfer release papers are known in the art. Most often, such release sheets are treated with silicones or other release agent for facilitating a designed release temperature. Of importance in selecting the release sheet is its dimensional stability for maintaining tolerances of the resist. Release properties and printing properties of the sheet also are important. The resist pattern on the decal desirably is release at a temperature ranging from between about 93° and 260° C. Preferably, the resist is screen printed onto the release sheet in conventional fashion followed by drying of the applied ink optionally with thermal and/or forced air augmentation. Thereafter, the hot stamping resist decal is hot stamped in a conventional hot stamping press with the platens set at a temperature adequate for the pattern to be released from the decal with conventional pressures simultaneously being applied.

Figure 2:
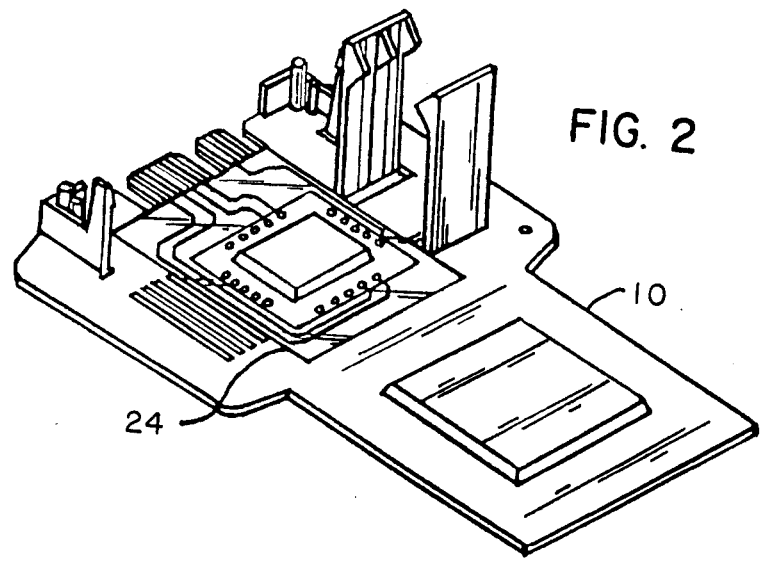
FIG. 2 shows the resist on the circuit board that results from hot stamping of the decal depicted at FIG. 1.

An example of a three-dimensional injection-molded circuit board having a resist decal mated therewith can be seen by reference to FIG. 1. Circuit board 10 is seen to possess several areas of three-dimensionality including a pair of upstanding arms 12 and 14, raised platforms 16 and 18, and a pair of upstanding mounts 20 and 22. These three-dimensional features preclude ordinary application of resist patterns via screen printing and like conventional techniques. Even the use of pad printing as disclosed in commonly-assigned application Ser. No. 07/389,285 filed on even date herewith has little applicability due to the interference presented by the upstanding features depicted for circuit board 10 and/or the need to tent holes. Accordingly, decal 24 is seen to have a pattern of the resist on one side thereof (looking through the decal to see the pattern in FIG. 1) which can be mated with the upper surface of circuit board 10. It will be appreciated that simultaneous application of decals to two sides of the circuit board also is possible. Mated decal 24 and circuit board 10 then can be placed in a conventional heated press for transfer of the pattern on decal 24 onto the upper surface of circuit board 10, which of course has been previously plated with copper. Thereafter, the applied resist will assume the pattern on circuit board 10 as set forth at FIG. 2.

With respect to suitable circuit boards that can be printed in accordance with the precepts of the present invention, it will be appreciated that the hot stamping resist decal technique can be applied to conventional substantially planar circuit boards, though conventional resist application technology can be utilized too. Of special value is the ability to apply the resist to three-dimensional circuit boards wherein conventional technology is inappropriate. A variety of thermoplastic materials can be utilized in forming injection-molded circuit boards, such as depicted in U.S. Pat. No. 4,591,220, for example. Such thermoplastic materials include, for example, ABS, polyether sulfone, polyether ether ketones (PEEK), polyphenylene sulfides, liquid crystalline polymers, polyetherimides, and the like. A preferred material comprises polyetherimide resins, such as disclosed in, for example, U.S. Pat. Nos. 3,803,805, 3,787,364, 3,917,643, 3,847,867, and 4,689,391.

The decal printed boards thereafter are processed in conventional fashion, etching a fully plated board utilizing a neutral-to-acid pH etch, or the board can be etched then plated. Thereafter, the resist can be removed with an aqueous alkaline media, which is a distinct advantage of the resist of the present invention. Aqueous alkaline media can be formed utilizing alkaline and alkaline earth metal hydroxides for efficiency and economy, though a wide variety of bases can be used in forming the aqueous alkaline stripping media.

The following Examples show how the present invention has been practiced, but should not be construed as limiting. In this application, all percentages and proportions are by weight and all units are in the metric system, unless otherwise expressly indicated. Also, all citations referred to herein are expressly incorporated herein by reference.

EXAMPLES

EXAMPLE 1

A hot stamping decal resist was prepared from the ingredients set forth below:

TABLE 1

| Ingredient | Wt-Parts |
| --- | --- |
| Vehicle* | |
| Diacetone Alcohol | 251 |
| Acetyl Triethyl Citrate (Plasticizer) | 39 |
| Rosin Polymer | 98 |
| Pigments** | |
| Talc | 43 |
| Copper Phthalocyanine | 6 |
| Titanium Dioxide | 6 |
| Clay (organoclay rheological additive) | 11 |

*Citroflex A-2 brand of acetyl triethyl citrate plasticizer, Morflex Chemical Co., Greensboro, N.C. Poly-Pale polymerized rosin: softening point 98°–106° C., sp. gr. 1.07, Hercules, Inc. Wilmington, Del. Scripset 550 styrene/maleic anhydride ester: mixed methyl and sec butyl partial ester of styrene/maleic anhydride copolymer, CAS No. 65652-36-0, Monsanto Company, St. Louis, Mo.
**Mistron ZSC talc, Cypress Industrial Minerals Co., Englewood, Co. Bentone 38 clay, NL Chemicals/NL Industries, Highstown, N.J.

A 230 mesh stainless steel screen (BOTT mesh) was used to screen print decals for a molded circuit board. The decals were screened onto Transvert-75 heat transfer release paper (Hobart MacIntosh Paper Co.). The decals were dried overnight (18 hours).

A Franklin 8200 hot stamping press was used to hot stamp two decals onto each side of the double-sided circuit board. The temperature setting for the platen was about 204° C. (400° F.). The pressure was 40 psi. The dwell time was 8 seconds. For the second decal applied to each side, the same temperature and pressure settings were used for a dwell time of 6 seconds. The hot stamp pad was a 1.5875 mm (1/16 inch) silicon rubber backed by a 3.175 mm (⅛ inch) alumnimum plate. Thereafter, the circuit boards were etched in aqueous ferric chloride. Finally, the resist was stripped with Hubbard Hall 50 aqueous alkaline stripper. The boards then were cleaned, visually inspected, and electrically tested to give greater than 90% yield of high quality boards.

EXAMPLE 2

Three resist formulations were made in a Waring blender followed by two passes through a three-roll mill. The base formulation is set forth below.

TABLE 2

| Formulation 10-1 | |
| --- | --- |
| Ingredient | Wt (g) |
| Diacetone Alcohol | 178 |
| Ethylene Glycol Monobutyl Ether | 27 |
| Scripset 550 SMA Ester | 60 |
| Poly-Pale Rosin | 105 |
| Mistron ZSC Talc | 53.6 |
| Phthalocyanine Blue | 3.6 |

The base formulation was made by adding the diacetone alcohol and butyl carbitol to a Waring blender along with the rosin. Stirring was conducted until the rosin dissolved. The styrene/maleic anhydride ester copolymer then was added with stirring which was continued until a good dispersion resulted (about 5 minutes). The resulting cloudy mixture then was permitted to stand two hours and became clear. Finally, the talc and blue pigment were added by a spatula with stirring. The mixture was put twice through a three-roll mill.

To base Formulation 10-1 (130 g) was added 0.5% Bentone 38 clay (NL Chemicals/NL Industries, Inc., Hightstown, N.J.) and Formulation 10-2 put through a three-roll mill twice. Formulation 10-3 was made by adding to base Formulation 10-1 (224 g) 0.5% Cab-O-Sil fumed silica (Cabot Corp., Tuscola, Ill.) and Formulation 10-3 put through a three-roll mill twice. Decals then were screened through a 270 mesh stainless steel screen.

For base Formulation 10-1 the screened image contained little bubbles and pinholes in the circuitry. For Formulation 10-2, no pinholes were observed and only little bubbles. A clear, continuous screened image resulted. For Formulation 10-3, little bubbles in the screened image were evident, but the edges were especially sharp.

The foregoing data demonstrates the importance of adding a clay to the resist in order to produce especially high quality screened images with no opens when stamped onto circuit boards. The data also shows that the fumed silica can be added to yield sharper image lines. Thus, the desirability of incorporating particulate fillers into the resist has been demonstrated.

EXAMPLE 3

It is desirable to add a plasticizer to the resist, since the film can be brittle once the solvent has evaporated. Brittleness can lead to chipping of the decal image and also the image on the circuit board. This chipping can result in circuit opens. Plasticizers should also increase the strength of the tents over PTHs. Several plasticizers were evaluated utilizing the following base formulation.

TABLE 3

| Formulation 20A | |
| --- | --- |
| Ingredient | Wt (g) |
| Diacetone Alcohol | 168 |
| Ethylene Glycol Monobutyl Ether | 27 |
| Poly-Pale Rosin | 105 |
| Scripset 550 SMA Ester | 60 |

TABLE 4

| Run No. | Ingredient | Amt (g) | Results |
| --- | --- | --- | --- |
| 20-1 | Formulation 20A | 20 | Brittle Film |
| | Dibutoxyethyl phthalate | 2 | |
| 20-2 | Formulation 20A | 20 | Very spongy and |
| | Dibutoxyethyl phthalate | 4 | soft, tacky, ductile film |
| 20-3 | Formulation 20A | 20 | Brittle Film |
| | Butyl phthalyl butyl glycolate | 2 | |
| 20-4 | Formulation 20A | 20 | Somewhat tacky, ductile |
| | Butyl phthalyl butyl glycolate | 4 | film-Second best |
| 20-5 | Formulation 20A | 20 | Brittle film |
| | Acetyl triethyl citrate | 2 | |
| | Formulation 20A | 20 | Good, ductile film |
| | Acetyl triethyl | 4 | Best tested |

TABLE 4-continued

| Run No. | Ingredient | Amt (g) | Results |
|---|---|---|---|
| | citrate | | |

Ductile versus brittle was determined by attempting to peel the film from a glass plate with the help of a razor blade. A ductile film results if the film can be successfully peeled off the glass plate. The foregoing data establishes that plasticizers reduce the brittleness of the resist films.

EXAMPLE 4

One of the major advantages of the hot stamp method of the present invention is the ability to tent holes which allows PTHs to be manufactured in a print and etch process. To answer the question of which gives a strong tent, higher solids resulting in greater film thickness, or higher molecular weight polymers, the following two formulations were compounded:

TABLE 5

| | Formulation No. Amount (g) | |
|---|---|---|
| Ingredient | 36-1 | 36-2 |
| Diacetone Alcohol | 168 | 168 |
| Citroflex A2 Plasticizer | 32 | 45 |
| Poly-Pale Rosin | 0 | 70 |
| Scripset 550 SMA Ester | 70 | 70 |
| Mineral Spirits | 27 | 27 |
| Mistron ZSC Talc | 30 | 54 |
| Phthalocyanine Blue | 5 | 5 |
| Titanium Dioxide | 5 | 5 |
| Bentone 38 Clay | 9 | 9 |
| Total Weight | 346 | 453 |
| Total Solids (%) | 51 | 63 |

Formulation 36-1 gave the stronger tents as measured by the number of tents broken on two-sided circuit boards which were hot-stamped on one side only. Formulation 36-1 had no tents broken in the stamping of 15 boards. Formulation 36-2, however, had three or more broken tents on each of the 15 boards hot-stamped with such resist formulation. Thus, this data shows that the rosin polymer adversely affected the properties of the resist and consequently, should not be included in resist formulations when tenting of PTHs is important.

I claim:

1. A method for applying a resist to a circuit board which comprises:
    (a) forming a resist decal comprising a release sheet bearing a predetermined pattern of the dried residue of a resist which comprises between about 35 and 65 weight percent of an ester of a styrene/maleic anhydride copolymer, between about 1 and 40 weight percent of a particulate filler, an organoclay rheological additive and a solvent, said predetermined pattern being formed by screen-printing said resist on said release sheet;
    (b) mating said resist decal and said circuit board; and
    (c) subjecting said mated resist decal/circuit board to elevated temperature between about 93° and 260° C. and elevated pressure to hot-stamp said resist pattern onto said circuit board.

2. The method of claim 1, wherein said filler comprises a fumed silica.

3. The method of claim 1, wherein said hot-stamped, plated circuit board is neutral-to-acid pH etched, and then said resist is removed with an aqueous alkaline solution.

4. The method of claim 3, wherein said aqueous alkaline solution is an aqueous alkali or alkaline earth metal stripping solution.

5. The method of claim 4, wherein said aqueous alkaline solution comprises aqueous sodium hydroxide.

* * * * *